(12) United States Patent
Tsuchizawa et al.

(10) Patent No.: US 11,996,489 B2
(45) Date of Patent: May 28, 2024

(54) OPTICAL MODULE AND METHOD FOR MANUFACTURING THE SAME

(71) Applicant: Nippon Telegraph and Telephone Corporation, Tokyo (JP)

(72) Inventors: Tai Tsuchizawa, Tokyo (JP); Takuma Aihara, Tokyo (JP); Tatsuro Hiraki, Tokyo (JP)

(73) Assignee: Nippon Telegraph and Telephone Corporation, Tokyo (JP)

(*) Notice: Subject to any disclaimer, the term of this patent is extended or adjusted under 35 U.S.C. 154(b) by 387 days.

(21) Appl. No.: 17/615,976

(22) PCT Filed: Jun. 6, 2019

(86) PCT No.: PCT/JP2019/022569
§ 371 (c)(1),
(2) Date: Dec. 2, 2021

(87) PCT Pub. No.: WO2020/245988
PCT Pub. Date: Dec. 10, 2020

(65) Prior Publication Data
US 2022/0328704 A1 Oct. 13, 2022

(51) Int. Cl.
H01L 31/0232 (2014.01)
G02B 6/122 (2006.01)
G02B 6/132 (2006.01)
H01L 31/028 (2006.01)
H01L 31/103 (2006.01)
H01L 31/18 (2006.01)
G02B 6/12 (2006.01)

(52) U.S. Cl.
CPC ...... *H01L 31/02327* (2013.01); *G02B 6/1228* (2013.01); *G02B 6/132* (2013.01); *H01L 31/028* (2013.01); *H01L 31/103* (2013.01); *H01L 31/1808* (2013.01); *G02B 2006/12061* (2013.01); *G02B 2006/12123* (2013.01)

(58) Field of Classification Search
None
See application file for complete search history.

(56) References Cited

U.S. PATENT DOCUMENTS

2003/0194192 A1* 10/2003 Ido .................... G02B 6/42
385/129
2018/0231714 A1 8/2018 Collins

FOREIGN PATENT DOCUMENTS

JP 2017191158 A 10/2017

* cited by examiner

Primary Examiner — Suberr L Chi
(74) Attorney, Agent, or Firm — Slater Matsil, LLP

(57) ABSTRACT

A silicon nitride core is formed on a silicon core via a first silicon oxide layer, and a germanium pattern caused to selectively grow in an opening penetrating through a second silicon oxide layer formed on the silicon nitride core and the first silicon oxide layer is formed on a lower silicon pattern formed to be continuous with the silicon core, thereby constituting a Ge photodiode.

10 Claims, 14 Drawing Sheets

OPTICAL MODULE AND METHOD FOR MANUFACTURING THE SAME

CROSS-REFERENCE TO RELATED APPLICATIONS

This application is a national phase entry of PCT Application No. PCT/JP2019/022569, filed on Jun. 6, 2019, which application is hereby incorporated herein by reference.

TECHNICAL FIELD

The present invention relates to an optical module and a method for manufacturing the optical module, and particularly to an optical module including an optical waveguide element and a photodiode and a method for manufacturing the optical module.

BACKGROUND

With the recent distribution of broadband access for the purpose of distribution of large-volume contents and the like, further enhancement of ultrahigh-speed and large-volume signal transmission abilities of optical fiber communication systems, and further, reduction of power consumption have been required. In order to respond to the requirement, distribution of digital coherent optical communication in which optical phase information is transmitted as signals has started recently in addition to a light intensity transmission scheme in which light intensity is transmitted as signals. For these high-speed, large-volume, and low-power-consumption optical communication systems, it is essential to develop optoelectronic integration techniques for integrating functions of optical components and electrical components. Thus, development of small-sized electronic integration techniques using silicon photonics that leads to satisfactory merging of light and electrons and that is advantageous for low power consumption has advanced.

Basic optical components for optoelectronic integration techniques of silicon photonics are constituted by a silicon-based optical waveguide and a germanium (Ge) photodiode. So far, a small-sized optical module produced by monolithically integrating a SiON optical waveguide that uses acid SiN (SiON) as a core for serving as a silicon-based optical waveguide and a Ge photodiode on the same silicon substrate has been developed (see Patent Literature 1), and application thereof to communication systems has been started. In recent years, research and development have been actively conducted on replacing optical waveguide elements with SiN waveguides using SiN that has a higher refractive index than SiON as cores in order to achieve further reduction in size and increase in speed of optical modules.

CITATION LIST

Patent Literature

Patent Literature 1: JP 2017-191158 A.

SUMMARY OF THE INVENTION

Technical Problem

However, the following problems have been identified in the application of a structure or a production method of an integrated module using a SiON optical waveguide according to the current system to an integrated module of a SiN optical waveguide and a Ge photodiode.

First, because SiN has a higher refractive index than SiON (SiN: ~2, SiON: ~1.5), the core thickness of the SiN optical waveguide that satisfies a single-mode condition in a communication wavelength band ranges from 0.4 to 0.6 μm, which is significantly thinner than 2.0 to 3.0 μm in the case of the SiON optical waveguide. Also, the thickness of a SiN core is thinner than the thickness (about 1 μm) of a Ge film forming the photodiode.

Here, according to the current system using SiON, a SiON layer that is a first layer serving as a core is formed, a selective growth mask is formed thereon, Ge is caused to selectively grow in this state, the selective growth mask is removed through dry etching, a SiON layer that is a second layer serving as a core is then formed, and the layer serving as a core is formed to a desired thickness. Although the core thickness is about 3 μm in the current system using SiON, the core thickness is set to 0.4 to 0.6 μm in a case in which SiN is used as described above, and thus if it is attempted to apply the aforementioned current system, a margin for thickness control is small in film formation and etching and it is difficult to produce an optical waveguide having satisfactory properties with satisfactory reproducibility.

In the current system, a SiON core with a thickness of about 3 μm is disposed in a Si core constituting the optical waveguide connected to the Ge photodiode. In this context, the following problem has been identified: when the thin SiN core with a thickness of 0.4 to 0.6 μm is used, it is not possible to ignore a step difference due to presence of the Si core on the lower side, and properties of the optical waveguide constituted by the SiN core.

Further, there is another problem: when SiN that does not contain oxygen is used as a raw material, the exposition of SiN during the Ge selective growth causes Ge to adhere to the exposed portion, and as a result, a waveguide loss increases. As described above, it is not easy for the current system to monolithically integrate the Ge photodiode and the optical waveguide including the SiN core on the same substrate.

The present invention was made in order to solve the aforementioned problems, and an object thereof is to enable a Ge photodiode and an optical waveguide including a SiN core to be monolithically integrated on the same substrate.

Means for Solving the Problem

A method for manufacturing an optical module according to embodiments of the present invention is a method for manufacturing an optical module in which a germanium photodiode, a silicon optical waveguide including a silicon core, and a silicon nitride optical waveguide including a silicon nitride core are optically connected in that order, the method including: a first step of forming a lower clad layer including silicon oxide on a silicon substrate; a second step of forming a silicon layer on the lower clad layer; a third step of patterning the silicon layer to form a lower silicon pattern in a first region and forming the silicon core in a second region that is continuous with the first region; a fourth step of forming a first silicon oxide layer including silicon oxide on the lower clad layer so as to cover the lower silicon pattern and the silicon core; a fifth step of forming a silicon nitride layer including silicon nitride on the first silicon oxide layer; a sixth step of removing some of the silicon nitride layer in a region corresponding to the first region and a part of the second region that is continuous with the first region to cause the first silicon oxide layer to be exposed therefrom; a seventh step of forming a second silicon oxide layer including silicon oxide on the first silicon oxide layer and the silicon nitride layer after the sixth step; an eighth step of forming an opening in the second silicon oxide layer and the first silicon oxide layer above the lower silicon pattern; a ninth step of selectively growing germanium on the lower silicon pattern at a bottom portion of the opening using the second silicon oxide layer as a selective growth mask to form a germanium pattern and forming the germanium photodiode including the lower silicon pattern and the germanium pattern; a tenth step of patterning the second silicon oxide layer and the silicon nitride layer to form the silicon nitride core from a part of the second region to a third region that is continuous with the second region such that a part of the second silicon oxide layer is disposed on the silicon nitride core; and an eleventh step of forming an upper clad layer including silicon oxide on the germanium photodiode, the silicon core, and the silicon nitride core.

In a configuration example of the aforementioned method for manufacturing an optical module, the silicon nitride layer is formed by an ECR plasma CVD method using $SiD_4$ and $N_2$ as raw material gases.

An optical module according to embodiments of the present invention includes: a silicon substrate; a lower clad layer that includes silicon oxide and is formed on the silicon substrate; a germanium photodiode that is formed in a first region on the lower clad layer; a silicon core that is formed in a second region, which is continuous with the first region, on the lower clad layer; a first silicon oxide layer that includes silicon oxide and is formed on the lower clad layer so as to cover the silicon core; a silicon nitride core that is formed from a part of the second region to a third region, which is continuous with the second region, on the first silicon oxide layer; a second silicon oxide layer that includes silicon oxide and is formed on the silicon nitride core; and an upper clad layer that includes silicon oxide and is formed on the second silicon oxide layer so as to cover the germanium photodiode and the second silicon oxide layer, wherein the germanium photodiode includes a lower silicon pattern formed to be continuous with the silicon core and a germanium pattern formed on the lower silicon pattern, and the optical module is formed such that the germanium photodiode, a silicon optical waveguide constituted by the silicon core, and a silicon nitride optical waveguide constituted by the silicon nitride core are optically connected in that order.

In a configuration example of the aforementioned optical module, the second silicon oxide layer is formed to cover the silicon nitride core.

In a configuration example of the aforementioned optical module, in the second region, the silicon nitride core is disposed to be superimposed over the silicon core.

In a configuration example of the aforementioned optical module, at least either a distal end portion of the silicon core on a side of the third region or a distal end portion of the silicon nitride core on a side of the first region is tapered toward the distal end.

In a configuration example of the aforementioned optical module, hydrogen contained in the silicon nitride core is deuterium.

Effects of Embodiments of the Invention

As described above, according to embodiments of the present invention, it is possible to monolithically integrate the Ge photodiode and the optical waveguides including SiN cores on the same substrate.

DETAILED DESCRIPTION OF ILLUSTRATIVE EMBODIMENTS

Figure 1:
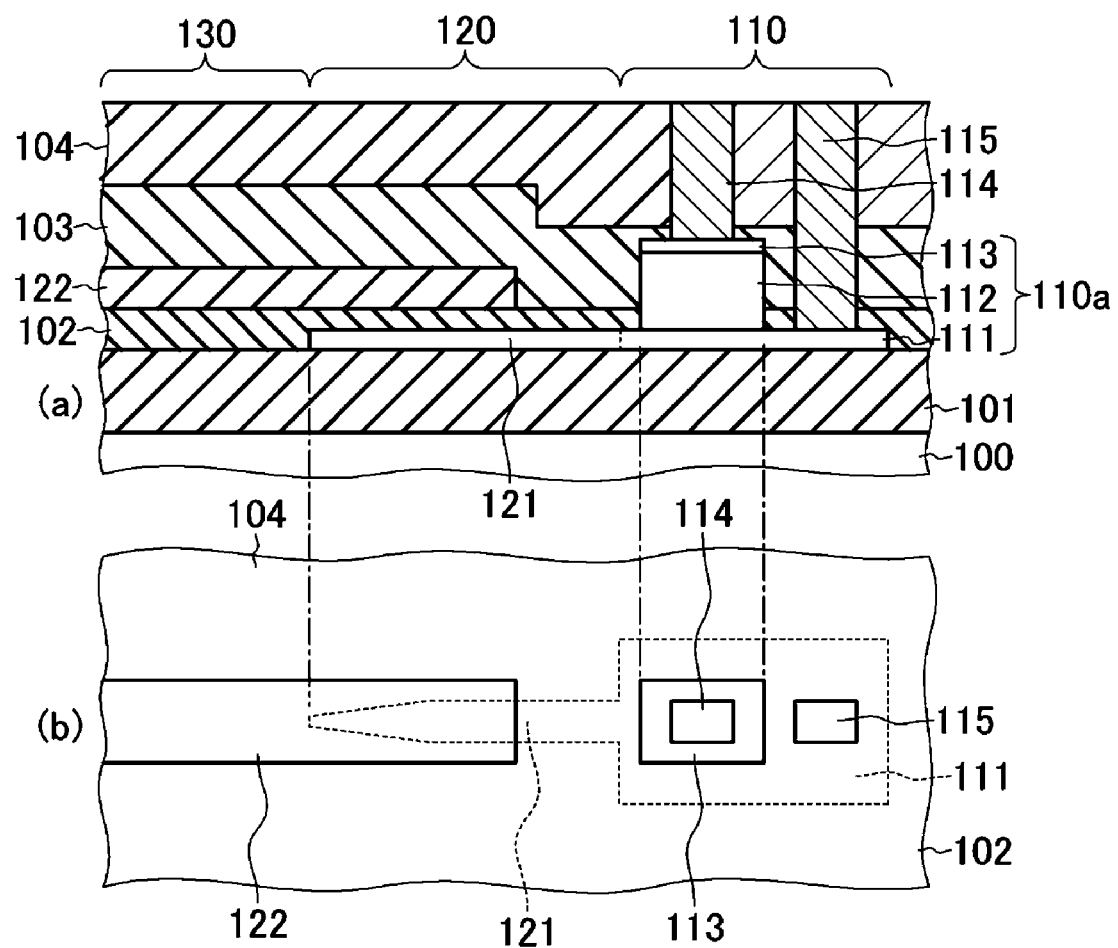
FIG. 1 is a set of a sectional view (a) and a plan view (b) respectively illustrating a configuration of an optical module according to an embodiment of the present invention.

Hereinafter, an optical module according to an embodiment of the present invention will be described with reference to FIG. 1.

The optical module includes a silicon substrate 100, a lower clad layer 101 including silicon oxide ($SiO_2$) formed on the silicon substrate 100, a germanium photodiode 110a formed in a first region 110 on the lower clad layer 101, a silicon core 121 formed in a second region 120, which is continuous with the first region 110, on the lower clad layer 101, and a first silicon oxide layer 102 including silicon oxide formed on the lower clad layer 101 so as to cover the silicon core 121.

Also, the optical module includes a silicon nitride core 122 formed from a part of the second region 120 to a third region 130, which is continuous with the second region 120, on the first silicon oxide layer 102, a second silicon oxide layer 103 including silicon oxide that is formed on the silicon nitride core 122, and an upper clad layer 104 including silicon oxide that is on the second silicon oxide layer 103 and is formed to cover a germanium photodiode 110a and the second silicon oxide layer 103. In the second regions 120, the silicon nitride core 122 is disposed to be superimposed over the silicon core 121. Note that the second silicon oxide layer 103 functions as a clad. The second silicon oxide layer 103 is formed to cover the silicon nitride core 122. Also, the side surface of the germanium pattern 112 is covered with the first silicon oxide layer 102 and the second silicon oxide layer 103. The silicon nitride core 122 is covered with the second silicon oxide layer 103, the side surface of the germanium pattern 112 is covered with the first silicon oxide layer 102 and the second silicon oxide layer 103, and the silicon nitride core 122 and the germanium pattern 112 are separated without coming into contact with each other.

The germanium photodiode 110a includes a lower silicon pattern 111 of a first conductive type that is formed to be continuous with the silicon core 121, the germanium pattern 112, which is non-doped (i-typed), formed on the lower silicon pattern 111, and an upper silicon pattern 113 of a second conductive type formed on the germanium pattern 112. For example, the first conductive type can be a p type while the second conductive type can be an n type.

For example, the lower clad layer 101 is formed to have a layer thickness of about 3 μm, and the upper clad layer 104 is formed to have a layer thickness of about 5 μm. The silicon core 121 is formed to have a section with a width of about 300 to 600 nm and a height of about 200 to 300 nm. The silicon nitride core 122 is formed to have a section with a width of about 1.0 to 1.2 μm and a height of about 0.5 to 0.6 μm. The second silicon oxide layer 103 has a thickness of about 1 μm in the first region. The silicon optical waveguide in the second region 120 where the silicon core 121 is formed has an optical waveguide length of about 200 to 500 μm.

The germanium pattern 112 has an entire thickness of about 1 μm. Also, the germanium photodiode 110a is formed into a rectangular shape of about 10×50 μm in a plan view. Note that the germanium pattern 112 can also be constituted by an i-type lower germanium layer and an upper germanium layer of the second conductive type, for example.

The aforementioned optical module is monolithically formed on the silicon substrate 100 in a state in which the germanium photodiode 110a, the silicon optical waveguide constituted by the silicon core 121, and the optical waveguide constituted by the silicon nitride core 122 are optically connected in that order.

Note that a contact wiring 114 that penetrates through the second silicon oxide layer 103 and the upper clad layer 104 on the upper silicon pattern 113 and is connected to the upper silicon pattern 113 is included. Also, a contact wiring 115 that penetrates through the upper clad layer 104 and the second silicon oxide layer 103 and is connected to the lower silicon pattern 111 is included.

In the optical module, light that has been guided by the optical waveguide in the third region 130 constituted by the silicon nitride core 122 can be shifted to the silicon optical waveguide constituted by the silicon core 121 with a higher refractive index in the silicon core 121 in the region covered with the silicon nitride core 122 first. Then, the light guided by the silicon optical waveguide can be absorbed by the germanium pattern 112 with a yet higher refractive index on the lower silicon pattern in that is continuous with the silicon core 121.

As described above, according to the embodiment, the germanium photodiode 110a can perform photoelectric conversion on the light guided by the optical waveguide constituted by the silicon nitride core 122. Because germanium has high light sensitivity to light having a wavelength band of from 1.3 to 1.6 μm, which is a communication wavelength band, monolithic integration of the optical waveguide device constituted by the silicon nitride core 122 and the germanium photodiode on the same substrate is significantly advantageous for realizing a small-sized communication optical module with high performance.

Next, a method for manufacturing the optical module according to the embodiment of the present invention will be described using FIGS. 2A to 2L. FIGS. 2A to 2K are configuration diagrams illustrating states in steps for explaining the method for manufacturing the optical module according to the embodiment of the present invention. FIGS. 2A to 2J schematically illustrate sections.

Figure 2A:
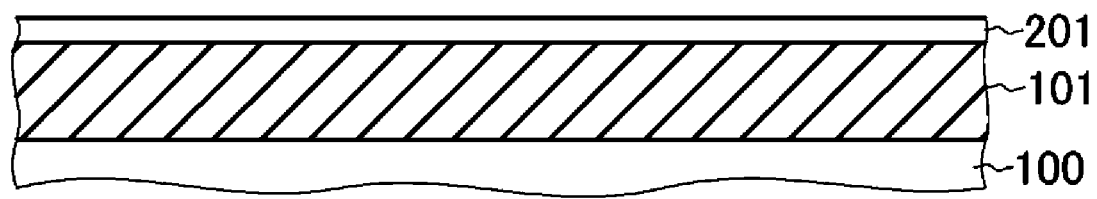
FIG. 2A is a configuration diagram illustrating a state in each step for explaining a method for manufacturing the optical module according to the embodiment of the present invention.

First, as illustrated in FIG. 2A, the lower clad layer 101 including $SiO_2$ is formed on the silicon substrate 100 (first step), and the silicon layer 201 is formed on the lower clad layer 101 (second step). This is achieved using a well-known silicon-on-insulator (SOI) substrate. The SOI substrate is a substrate including a surface silicon layer formed on a silicon base portion via an embedded insulating layer. The silicon base portion serves as the silicon substrate 100, the embedded insulating layer serves as the lower clad layer 101, and the surface silicon layer serves as the silicon layer 201.

Figure 2B:
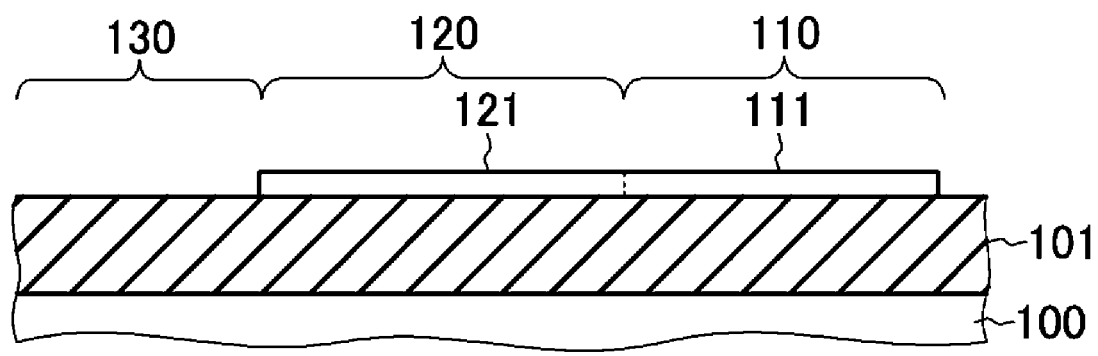
FIG. 2B is a configuration diagram illustrating a state in each step for explaining the method for manufacturing the optical module according to the embodiment of the present invention.

Next, the silicon layer 201 is patterned to form the lower silicon pattern 111 and the silicon core 121 as illustrated in FIG. 2B (third step). The lower silicon pattern 111 and the silicon core 121 are integrally formed in a successive manner. For example, the aforementioned patterns can be formed by selective etching based on etching techniques using a mask pattern formed by well-known photolithography. Note that the mask pattern is removed after the patterns are formed. Also, impurities are introduced into the lower silicon pattern 111 through selective ion injection or the like to obtain the first conductive type. For example, it is possible to obtain the p type.

Figure 2C:
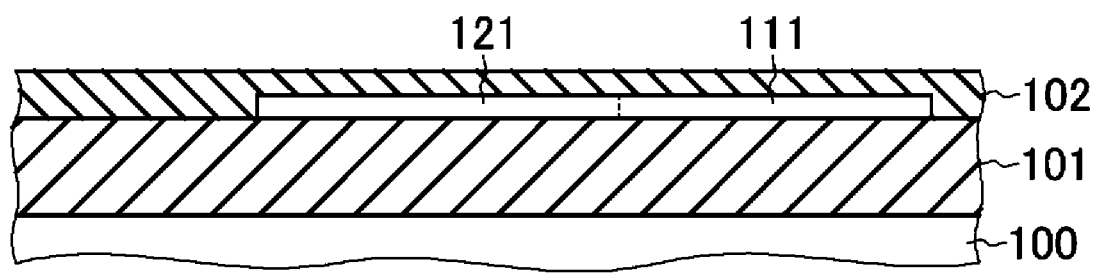
FIG. 2C is a configuration diagram illustrating a state in each step for explaining the method for manufacturing the optical module according to the embodiment of the present invention.

Next, as illustrated in FIG. 2C, the first silicon oxide layer 102 is formed on the lower clad layer 101 so as to cover the lower silicon pattern in and the silicon core 121 (fourth step). The first silicon oxide layer 102 can be formed, for example, by accumulating silicon oxide by a plasma CVD method, and polishing and etching the accumulated silicon oxide film to solve a step difference due to the silicon core 121 and thin and flatten the film.

Figure 2D:
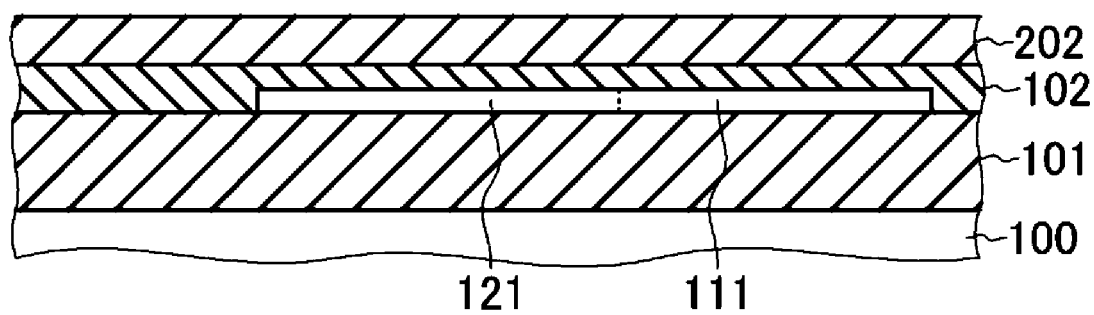
FIG. 2D is a configuration diagram illustrating a state in each step for explaining the method for manufacturing the optical module according to the embodiment of the present invention.

Next, as illustrated in FIG. 2D, the silicon nitride layer 202 is formed on the first silicon oxide layer 102 (fifth step). The silicon nitride layer 202 is accumulated by an ECR plasma CDV method using mixture gas of deuterium silane ($SiD_4$), $N_2$, and Ar. Utilization of the ECR plasma CVD method enables accumulation of silicon nitride with high quality without requiring substrate heating. Also, because utilization of $SiD_4$ gas causes hydrogen taken into silicon nitride to be mainly deuterium, the silicon nitride core 122 formed thereafter can realize an optical waveguide with a low loss.

Figure 2E:
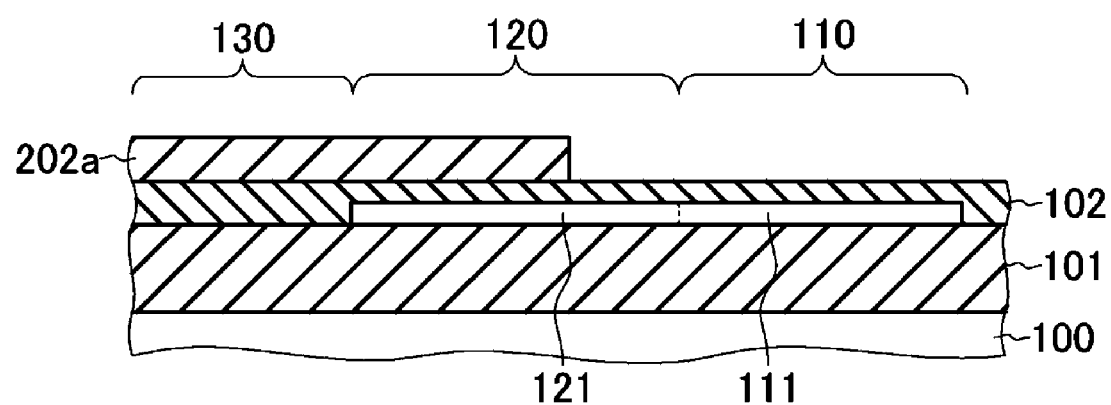
FIG. 2E is a configuration diagram illustrating a state in each step for explaining the method for manufacturing the optical module according to the embodiment of the present invention.

Next, some of the silicon nitride layer 202 in a region that corresponds to the first region 110 and a part of the second region 120 continuous with the first region 110 is removed to form a silicon nitride layer 202a from which the first silicon oxide layer 102 in this region is exposed as illustrated in FIG. 2E (sixth step). The silicon nitride layer 202a can be formed, for example, by patterning of the silicon nitride layer 202 using well-known photolithography and etching techniques. Also, the silicon nitride layer 202a can be formed by a well-known lift-off method. For example, although not illustrated in FIG. 2D, a lift-off mask is formed by the photolithography techniques in a region other than the location where the silicon nitride layer 202a is to be formed. Next, the silicon nitride layer 202 is formed on the first silicon oxide layer 102 with the lift-off mask formed thereon. The silicon nitride layer 202a can be formed by removing the lift-off mask thereafter.

Figure 2F:
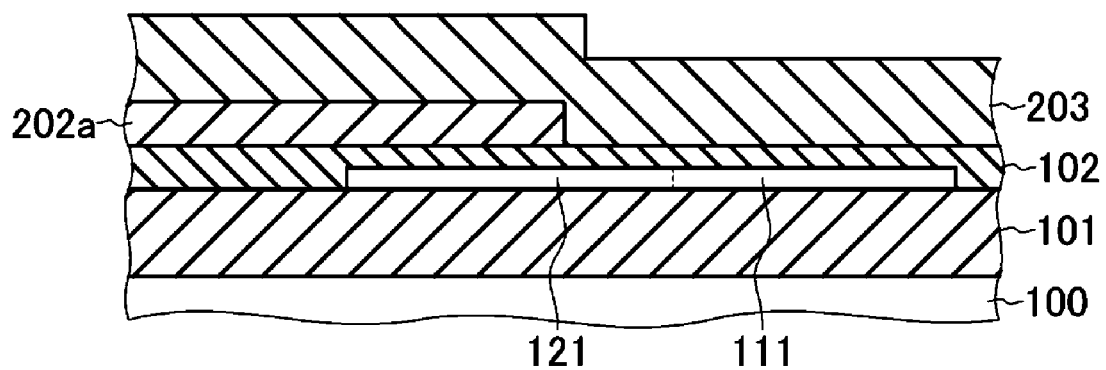
FIG. 2F is a configuration diagram illustrating a state in each step for explaining the method for manufacturing the optical module according to the embodiment of the present invention.

Next, as illustrated in FIG. 2F, the second silicon oxide layer 203 including silicon oxide is formed on the silicon nitride layer 202a and the exposed first silicon oxide layer 102 (seventh step).

Figure 2G:
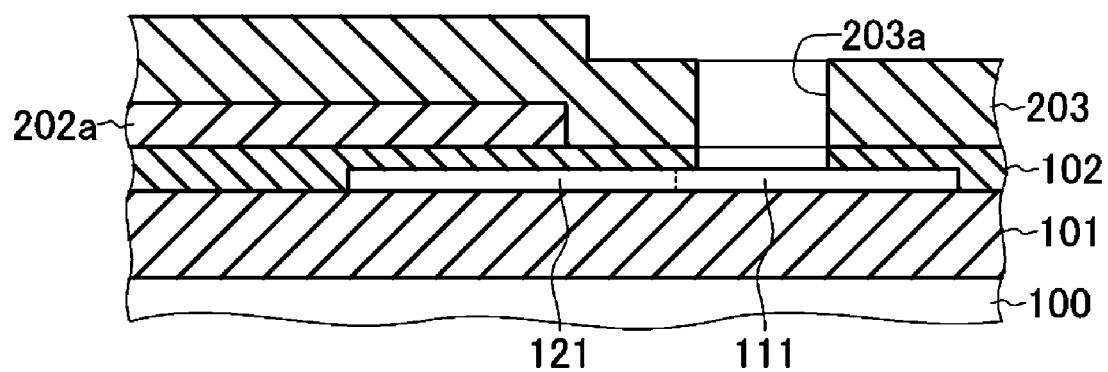
FIG. 2G is a configuration diagram illustrating a state in each step for explaining the method for manufacturing the optical module according to the embodiment of the present invention.

Next, as illustrated in FIG. 2G, an opening 203a is formed in the first silicon oxide layer 102 and the second silicon oxide layer 203 corresponding to the upper portion of the lower silicon pattern 111 (eighth step). The opening 203a can be formed by, for example, selective etching based on the etching techniques using a mask pattern formed by well-known photolithography. The opening 203a is formed such that the upper surface of the lower silicon pattern 111 is exposed from the bottom portion of the opening 203a. Note that the mask pattern is removed after the opening 203a is formed.

Figure 2H:
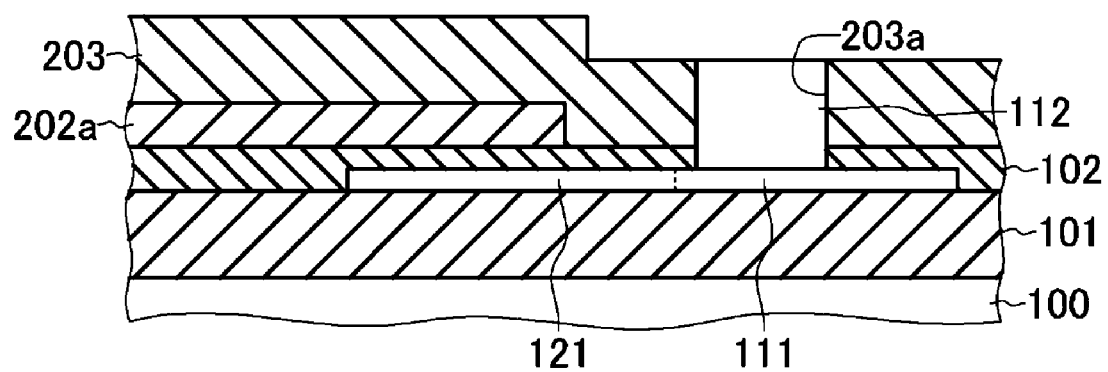
FIG. 2H is a configuration diagram illustrating a state in each step for explaining the method for manufacturing the optical module according to the embodiment of the present invention.

Next, as illustrated in FIG. 2H, the germanium pattern 112 is formed by causing germanium selectively grow on the lower silicon pattern 111 at the bottom portion of the opening 203a using the second silicon oxide layer 203 as a selective growth mask. Germanium can be selectively accumulated on the upper surface of the lower silicon pattern 111 exposed from the bottom portion of the opening 203a by accumulating germanium at a substrate temperature condition of 600° C. by a heat CVD method using $GeH_4$ as source gas. In the selective growth, germanium is not accumulated on the second silicon oxide layer 203.

Figure 2I:
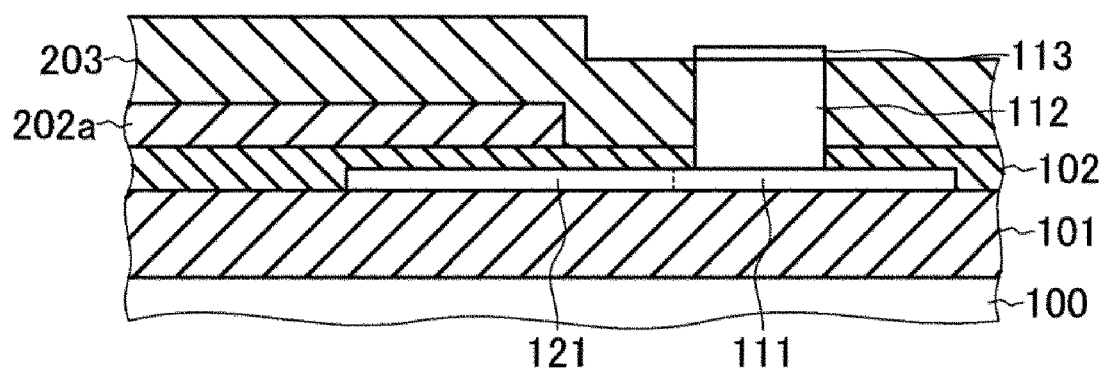
FIG. 2I is a configuration diagram illustrating a state in each step for explaining the method for manufacturing the optical module according to the embodiment of the present invention.

Next, as illustrated in FIG. 2I, the upper silicon pattern 113 of the second conductive type is formed on the germanium pattern 112. For example, a silicon layer is formed on the second silicon oxide layer 203 so as to include the portion of the germanium pattern 112. The silicon layer is patterned by etching using a mask pattern (not illustrated) formed by known lithography techniques as a mask, thereby forming the silicon pattern. Next, impurities are introduced into the formed silicon pattern through ion injection to obtain the second conductive type (the n type, for example), thereby forming the upper silicon pattern 113.

Note that an n-type upper layer portion of the germanium pattern 112 can be obtained through introduction of impurities up to a part of the germanium pattern 112 in the aforementioned introduction of impurities. For example, the thickness of the upper layer portion of the n type in the germanium pattern 112 can be changed by controlling ion energy in the ion injection. In this manner, the properties of the germanium photodiode 110a can be changed through a change in thickness of the upper layer portion of the n type in the germanium pattern 112. Note that the upper silicon pattern 113 has a larger area than the germanium pattern 112 in a plan view. Also, a state is achieved such that the germanium pattern 112 is disposed inside the upper silicon pattern 113 in a plan view.

As described above, the germanium photodiode 110a including the lower silicon pattern 111, the germanium pattern 112, and the upper silicon pattern 113 is formed by forming the upper silicon pattern 113 (ninth step). Note that in a case in which the upper layer portion of the germanium pattern 112 is of the second conductive type (the n type, for example), the upper silicon pattern 113 is not needed. If the upper layer portion of the germanium pattern 112 is formed as an n type, a pin structure is achieved by the lower silicon pattern 111, and this functions as a photodiode. In this case, an electrode is connected to the upper layer portion of the germanium pattern 112.

Figure 2J:
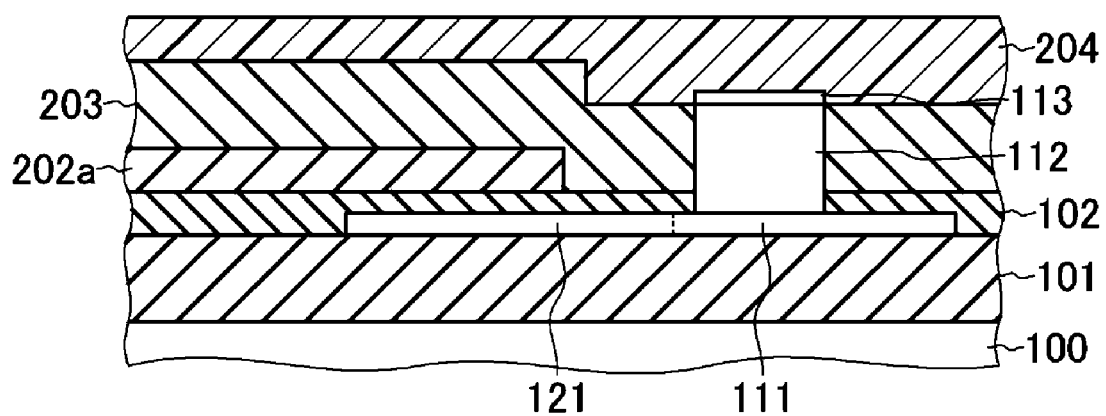
FIG. 2J is a configuration diagram illustrating a state in each step for explaining the method for manufacturing the optical module according to the embodiment of the present invention.

Next, as illustrated in FIG. 2J, a resist pattern 204 is formed on the second silicon oxide layer 203. the resist pattern 204 can be formed by forming a coating film coated with a well-known photoresist and patterning of the formed coating film by photolithography. Next, the second silicon oxide layer 203 and the silicon nitride layer 202a are successively and selectively etched using the resist pattern 204 as a mask.

Figure 2K:
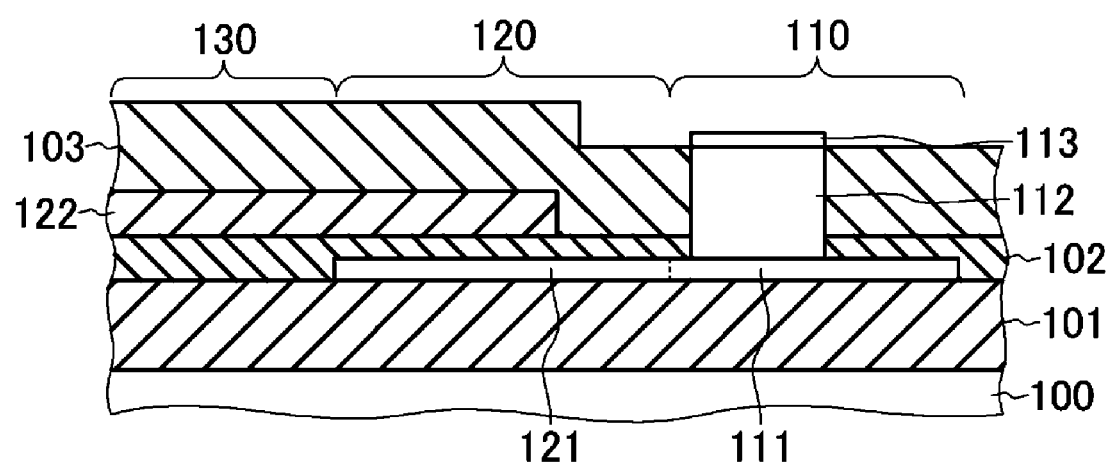
FIG. 2K is a configuration diagram illustrating a state in each step for explaining the method for manufacturing the optical module according to the embodiment of the present invention.

The silicon nitride core 122 is formed from a part of the second region 120 to the third region 130 that is continuous with the second region 120 as illustrated in FIG. 2K by the patterning processing such that a part of the second silicon oxide layer 103 is disposed on the silicon nitride core 122 (tenth step). Note that FIG. 2K illustrates a state after the resist pattern 204 is removed.

Figure 2L:
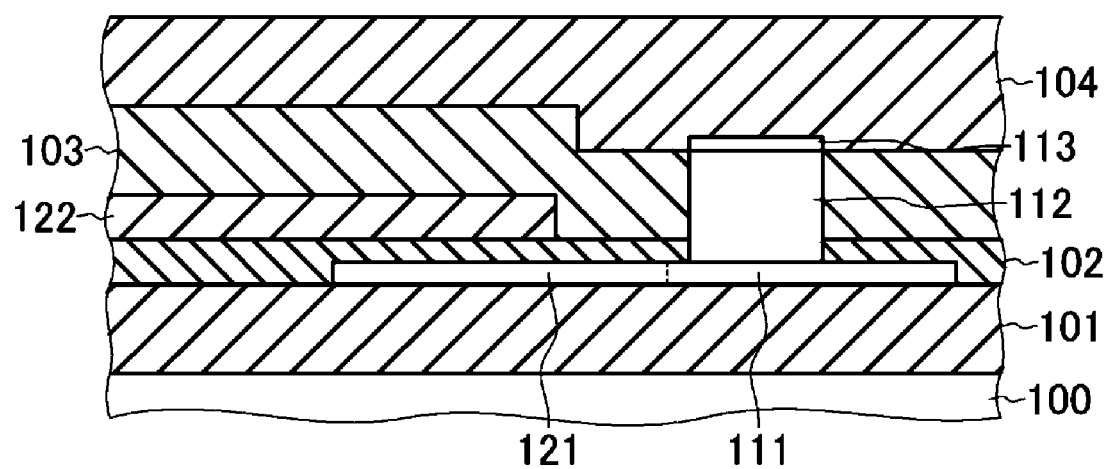
FIG. 2L is a configuration diagram illustrating a state in each step for explaining the method for manufacturing the optical module according to the embodiment of the present invention.

Next, the upper clad layer 104 is formed as illustrated in FIG. 2L by accumulating $SiO_2$, for example, on the first silicon oxide layer 102, the germanium photodiode 110a, and the second silicon oxide layer 103 the silicon core 121 (eleventh step).

In the formation of the upper clad layer 104, it is important to set the formation (accumulation) temperature condition to be equal to or less than 300° C. in order not to thermally damage the germanium photodiode 110a that has already been formed. According to the CVD method using an electron cyclotron resonance (ECR) plasma, for example, the upper clad layer 104 can be formed by accumulating $SiO_2$ with the aforementioned condition satisfied.

As described above, a state in which the germanium photodiode 110a, the optical waveguide constituted by the silicon core 121, and the optical waveguide constituted by the silicon nitride core 122 are optically connected in that order is obtained. Thereafter, the contact wiring 114 and the contact wiring 115 described above using FIG. 1 are formed by forming a contact hole in the upper clad layer 104 and filling the contact hole with an electrode material or the like.

Here, the following matters are important in the aforementioned formation of the silicon nitride layer. If hydrogen (H) is present in the silicon nitride layer, NH groups are generated, the NH groups absorb the band of 1.5 μm, which is a communication wavelength, and thus the guide of optical waves is hindered. It is thus important for the silicon nitride layer not to contain H.

To satisfy this condition, the silicon nitride layer is formed by the CVD method using, as raw material gas, gas containing at least deuterium silane ($SiD_4$) obtained by deuterating hydrogen and nitrogen ($N_2$) and using an ECR plasma. According to the ECR plasma CVD, silicon nitride can be accumulated so as to contain no hydrogen (H) in a gas system of $SiD_4$ and $N_2$ due to high gas decomposition efficiency. Also, the high gas decomposition efficiency of the ECR plasma CVD allows silicon nitride with high quality and satisfactory adhesiveness to be accumulated on a substrate without heating the substrate.

$SiD_4$ gas in the CVD method using the ECR plasma allows silicon nitride containing no hydrogen (H) to be accumulated even at a low temperature and thereby a silicon nitride core can be formed so as to include a silicon nitride layer that has neither an OH group nor an NH group and so as not to cause any loss in light transmission in the communication wavelength band. Deuterium is contained in the silicon nitride layer (silicon nitride core) due to utilization of $SiD_4$ gas. Note that the deuterium is characterized by not affecting properties because deuterium does not cause any loss in light transmission in the communication wavelength band.

According to the present embodiment, the silicon nitride layer that serves as the silicon nitride core is formed on the flat first silicon oxide layer with no step difference before the growth of germanium, and it is thus possible to form the silicon nitride layer with a thickness as designed.

Also, according to the present embodiment, the silicon nitride core is formed by causing germanium to grow using the second silicon oxide layer as a selective growth mask, and successively etching the second silicon oxide layer and the silicon nitride layer without removing the second silicon oxide layer used as the selective growth mask. The silicon nitride layer thus does not come into contact with the plasma and a washing chemical in the germanium photodiode formation step.

As a result, it is possible to realize, in the integration with the germanium photodiode, the optical waveguide constituted by the silicon nitride core with a low loss that is equivalent to that in a case in which a silicon nitride waveguide alone is used for production, with no degradation of the shape and the quality. As a result, it is possible to realize monolithic integration of the silicon optical waveguide, the silicon nitride optical waveguide, and the germanium photodiode on the same substrate.

In the present embodiment, the silicon nitride layer is formed by the ECR plasma CVD method using the $SiD_4$ gas and the $N_2$ gas, and H is thus not contained even in the silicon nitride layer formed at such a low temperature that no damage is given to germanium. Because neither an NH group nor an OH group that may cause a loss in the communication wavelength band is thus present, it is possible to achieve the monolithic integration of the silicon nitride optical waveguide and the germanium photodiode with a low loss in the communication wavelength band.

Figure 3:
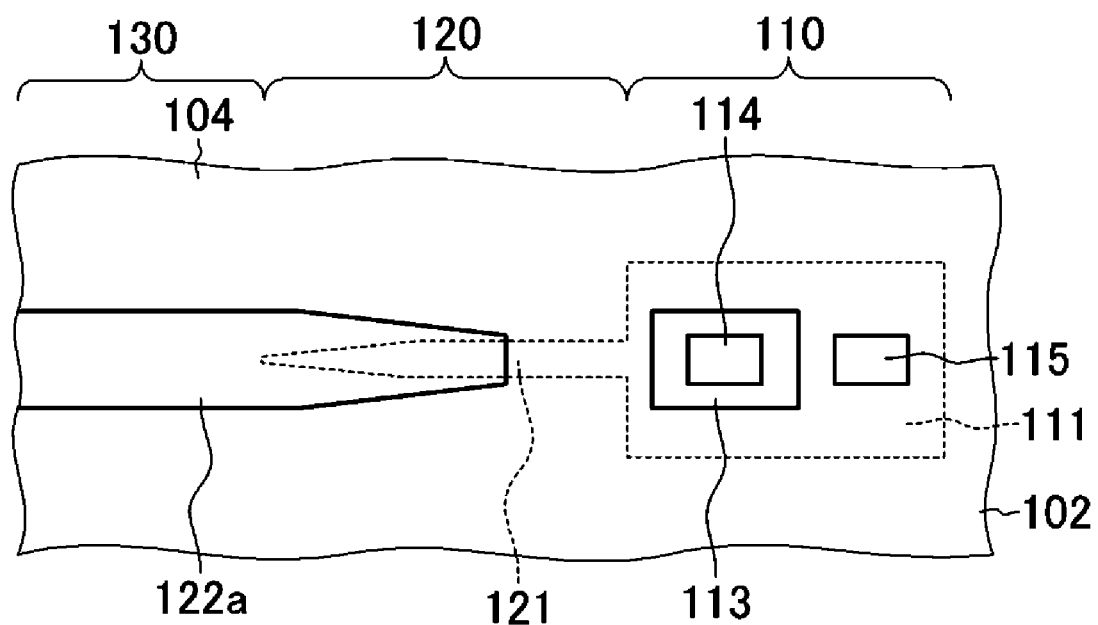
FIG. 3 is a plan view illustrating another configuration of the optical module according to the embodiment of the present invention.

Note that although the aforementioned embodiment has been described such that the distal end portion of the silicon core 121 on the side of the third region 130 is formed into a tapered shape tapering toward the distal end as illustrated in (b) of FIG. 1, the present invention is not limited thereto. For example, the distal end portion of the silicon nitride core 122a on the side of the first region no may be tapered toward the distal end as illustrated in FIG. 3. It is also possible to produce an integrated module with similar properties by forming the distal end of only the silicon nitride core to have a tapered shape tapered toward the tip with the silicon core not formed to be tapered. Efficiency of joining the two optical waveguides can be enhanced by forming both the distal ends of both the cores to have tapered shapes tapering toward tips.

As described above, according to embodiments of the present invention, it is possible to monolithically integrate the germanium photodiode and the optical waveguide made of silicon nitride on the same substrate and to obtain an excellent effect that an optical module provided with a small-sized and high-performance photodiode can be realized.

Note that the present invention is not limited to the embodiment described above, and it is obvious that many modifications and combinations can be implemented by a person having ordinary knowledge in the field within the technical spirit of the present invention. Although the upper clad layer is constituted by silicon oxide accumulated by the CVD method in the above description, for example, the present invention is not limited thereto. For example, the clad layer can also be formed through accumulation based on a sputtering method. Silicon oxide can be accumulated by the sputtering method.

Also, the lower clad layer can be formed through accumulation instead of utilization of the SOI substrate. It is also a matter of course that the silicon core is not limited to single-crystal silicon and may be polycrystalline silicon or amorphous silicon.

REFERENCE SIGNS LIST

100 Silicon substrate
101 Lower clad layer
102 First silicon oxide layer
103 Second silicon oxide layer
104 Upper clad layer
110 First region
110a Germanium photodiode
111 Lower silicon pattern
112 Germanium pattern
113 Upper silicon pattern
114 Contact wiring
115 Contact wiring
120 Second region
121 Silicon core
130 Third region.

The invention claimed is:

1. A method for manufacturing an optical module in which a germanium photodiode, a silicon optical waveguide including a silicon core, and a silicon nitride optical waveguide including a silicon nitride core are optically connected in that order, the method comprising:
   a first step of forming a lower clad layer comprising silicon oxide on a silicon substrate;
   a second step of forming a silicon layer on the lower clad layer;
   a third step of patterning the silicon layer to form a lower silicon pattern in a first region and forming the silicon core in a second region that is continuous with the first region;
   a fourth step of forming a first silicon oxide layer on the lower clad layer so as to cover the lower silicon pattern and the silicon core;
   a fifth step of forming a silicon nitride layer on the first silicon oxide layer;
   a sixth step of removing a portion of the silicon nitride layer in a third region corresponding to the first region and a part of the second region to expose the first silicon oxide layer;
   a seventh step of forming a second silicon oxide layer on the first silicon oxide layer and the silicon nitride layer after the sixth step;
   an eighth step of forming an opening in the second silicon oxide layer and the first silicon oxide layer above the lower silicon pattern;

a ninth step of selectively growing germanium on the lower silicon pattern at a bottom portion of the opening using the second silicon oxide layer as a selective growth mask to define a germanium pattern and forming the germanium photodiode, the germanium photodiode including the lower silicon pattern and the germanium pattern;

a tenth step of patterning the second silicon oxide layer and the silicon nitride layer to form the silicon nitride core extending from the second region to a fourth region that is continuous with the second region such that a part of the second silicon oxide layer is disposed on the silicon nitride core; and an eleventh step of forming an upper clad layer including silicon oxide on the germanium photodiode, the silicon core, and the silicon nitride core.

2. The method for manufacturing an optical module according to claim 1, wherein the silicon nitride layer is formed by an ECR plasma CVD method using $SiD_4$ and $N_2$ as raw material gases.

3. The method for manufacturing an optical module according to claim 1, wherein the second silicon oxide layer covers the silicon nitride core.

4. The method for manufacturing an optical module according to claim 1, wherein a distal end portion of the silicon core on a side of the third region or a distal end portion of the silicon nitride core on a side of the first region is tapered toward a distal end of the silicon core.

5. The method for manufacturing an optical module according to claim 1, wherein hydrogen contained in the silicon nitride core is deuterium.

6. An optical module comprising:
a silicon substrate;
a lower clad layer comprising silicon oxide on the silicon substrate;
a germanium photodiode in a first region on the lower clad layer;
a silicon core in a second region that is continuous with the first region, the silicon core being on the lower clad layer;
a first silicon oxide layer on the lower clad layer so as to cover the silicon core;
a silicon nitride core extending from the second region to a third region that is continuous with the second region, the silicon nitride core being on the first silicon oxide layer;
a second silicon oxide layer on the silicon nitride core; and
an upper clad layer comprising silicon oxide and on the second silicon oxide layer, the upper clad layer covering the germanium photodiode and the second silicon oxide layer,
wherein the germanium photodiode includes a lower silicon pattern that is continuous with the silicon core and a germanium pattern on the lower silicon pattern, and
wherein the optical module configured such that the germanium photodiode, a silicon optical waveguide constituted by the silicon core, and a silicon nitride optical waveguide constituted by the silicon nitride core are optically connected in that order.

7. The optical module according to claim 6, wherein the second silicon oxide layer covers the silicon nitride core.

8. The optical module according to claim 6, wherein in the second region, the silicon nitride core is superimposed over the silicon core.

9. The optical module according to claim 8, wherein a distal end portion of the silicon core on a side of the third region or a distal end portion of the silicon nitride core on a side of the first region is tapered toward a distal end of the silicon core.

10. The optical module according to claim 6, wherein hydrogen contained in the silicon nitride core is deuterium.

* * * * *